United States Patent [19]
Eshita

[11] Patent Number: 4,994,413
[45] Date of Patent: Feb. 19, 1991

[54] METHOD OF MANUFACTURING A SEMICONDUCTOR DEVICE HAVING A SILICON CARBIDE LAYER

[75] Inventor: Takashi Eshita, Inagi, Japan
[73] Assignee: Fujitsu Limited, Kawasaki, Japan
[21] Appl. No.: 420,465
[22] Filed: Oct. 12, 1989
[30] Foreign Application Priority Data
Oct. 12, 1988 [JP] Japan ................... 63-254898
[51] Int. Cl.[5] ............................ H01L 21/465
[52] U.S. Cl. .................... 437/244; 437/100; 437/31; 437/41; 437/62; 148/DIG. 148; 357/16
[58] Field of Search .............. 437/100, 918, 974, 244; 357/16; 148/DIG. 148

[56] References Cited
U.S. PATENT DOCUMENTS
3,662,458  5/1972  Formigoni et al. ............... 29/591
4,757,028  7/1988  Kondoh et al. ................... 437/100
4,762,806  8/1988  Suzuki et al. .................... 437/100

FOREIGN PATENT DOCUMENTS
3446961  7/1985  Fed. Rep. of Germany .
87831    5/1984  Japan .

OTHER PUBLICATIONS
Marsh et al.; "Ion-Implanted Junctions and Conducting Layers in SiC"; Radiation Effects 1970, vol. 6, pp. 301-312.
Shibahara et al.; "Inversion-Type MOS Field Effect Transistors Using CVD Grown Cubic SiC on Si"; Jap. J. Appl. Phys. 23, L863 (1984).
Ghandhi; "VLSI Fabrication Principles"; 1983; pp. 430-431, 575.
Furukawa et al.; "Insulated-Gate and Junction-Gate FET's of CVD-Grown $\beta$-SiC"; IEEE Elec. Device Letters, vol. EDL-8, No. 2, Feb. 1987.
IEEE Electron Device Letters, vol. EDL-7, No. 12, Dec. 1986, pp. 692-693, IEEE, New York, U.S.; K. Shibahara et al. "Fabrication of Inversion-Type n--Channel MOSFET's Using Cubic-SiC on Si(100)".

Primary Examiner—Brian E. Hearn
Assistant Examiner—Trung Dang
Attorney, Agent, or Firm—Staas & Halsey

[57] ABSTRACT

A method of forming a semiconductor device on a silicon carbide layer comprises steps of introducing an impurity into selected parts of the silicon carbide layer, and oxidizing the silicon carbide layer by annealing in an atmosphere containing oxygen.

12 Claims, 7 Drawing Sheets

METHOD OF MANUFACTURING A SEMICONDUCTOR DEVICE HAVING A SILICON CARBIDE LAYER

BACKGROUND OF THE INVENTION

The present invention generally relates to semiconductor devices and more particularly to a method of manufacturing a semiconductor device having a silicon carbide layer.

Silicon carbide is a material having an excellent stability against heat and radiation. Thus, a semiconductor device constructed on a silicon carbide layer is expected to play a major role in electronic instruments to be used in a high temperature and highly radioactive environment such as space vehicles, satellites or nuclear reactors.

Conventionally, a semiconductor device constructed on a silicon carbide layer has a problem in that the formation of an oxide layer on the surface of the silicon carbide layer is difficult because of the slow oxidation rate of silicon carbide. Usually, the oxidation rate of silicon carbide is less than one-tenth that of silicon. Because of this, the technique to of forming a device isolation structure by thermal oxidation, which is well established in the case of the device constructed on silicon, is not applicable and the semiconductor device constructed on a silicon carbide layer has to employ a complex mesa structure in order to achieve device isolation.

Figure 1A:
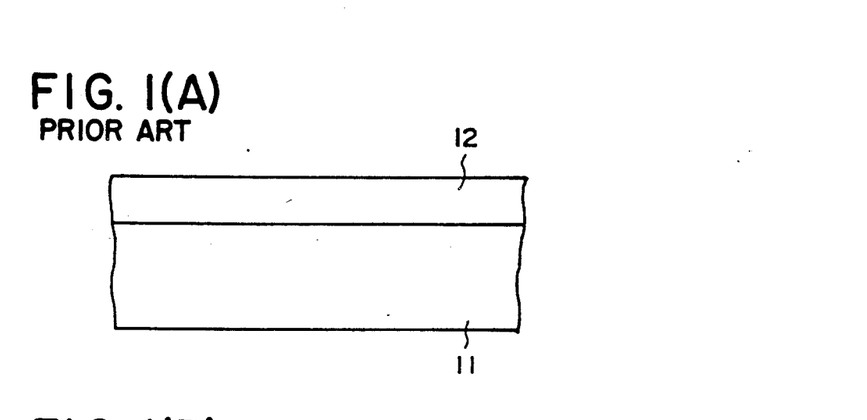
FIGS. 1(A)–1(C) are diagrams showing various steps for manufacturing a prior art semiconductor device constructed on a silicon carbide layer.
Figure 1B:
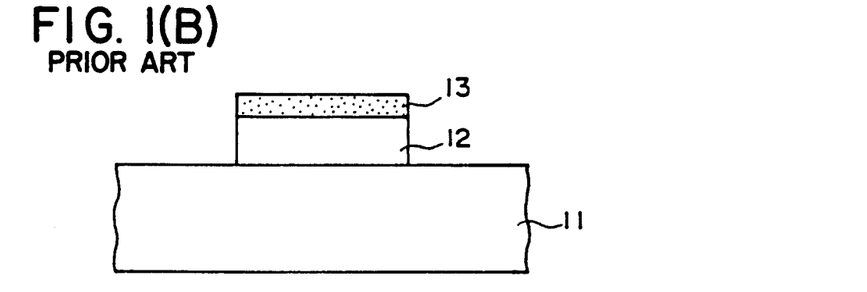
Figure 1C:
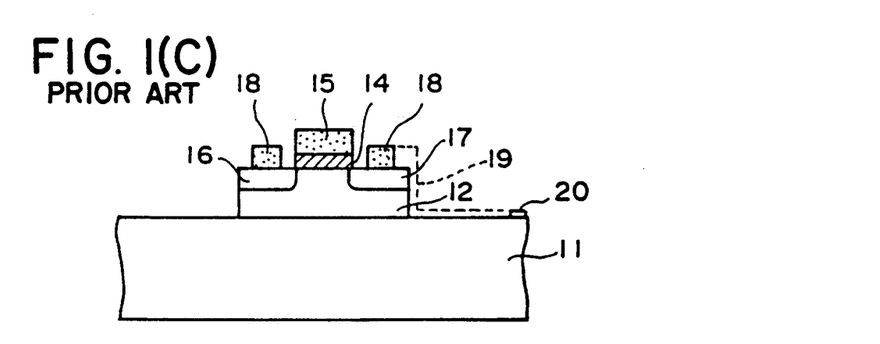

FIGS. 1(A)–(C) show a typical prior art process for manufacturing a metal-oxide-silicon field effect transistor (MOSFET) on a silicon carbide layer. Referring to FIG. 1(A), a silicon carbide layer 12 is grown on a silicon substrate 11 by chemical vapor deposition, and after deposition of aluminum layer 13 on the silicon carbide layer 12 and a subsequent patterning for exposing the silicon carbide layer 12 except for a device region in which the semiconductor device is to be formed, the structure is etched in a nitrogen trifluoride (NF$_3$) etching gas and structure shown in FIG. 1(B) is obtained. After the removal of remaining aluminum layer 13, a MOS structure comprising a gate oxide film 14, a gate electrode 15, source and drain regions 16 and 17, and source and drain electrodes 18 are formed by a well known process. Further, an aluminum interconnection 20 is provided on the substrate 11 so as to make contact with the source and drain electrodes 18 and a MOSFET shown in FIG. 1(C) is obtained.

The MOSFET thus obtained, however, has a problem in that the manufacturing process is complex as it involves the step of forming the mesa structure. Further, the integration density is limited because of the separation between the mesa structures. Associated with use of the mesa structure, there arises a further problem in that a leakage current flowing through a side wall of the mesa structure is increased because of minute projections and depressions formed on the side wall at the time of etching. It is believed that such of impurities on the side wall of the mesa structure and thus provide a path for the leakage current. Furthermore, the steep side wall of the mesa structure tends to cause a disconnection of the metal interconnection 20 particularly at a part 19 along the side wall where the interconnection is thin. The disconnection of the metal interconnection 20 is facilitated further by the minute projections and depressions of the side wall.

SUMMARY OF THE INVENTION

Accordingly, it is a general object of the present invention to provide a novel and useful method of manufacturing a semiconductor device having a silicon carbide layer, wherein, the aforementioned problems are eliminated.

Another and more specific object of the present invention is to provide a method of manufacturing a semiconductor device having a silicon carbide layer, comprising steps of introducing an impurity into a silicon carbide layer in correspondence to a region in which a device isolation structure is to be formed, and selectively oxidizing said region by annealing the device in an atmosphere containing oxygen. According to the present invention, the region in which the impurity is introduced is selectively oxidized and there is formed a thick silicon oxide layer in correspondence to the device isolation structure. As a result, the hitherto needed mesa structure as well as the patterning and etching processes associated with the formation of the mesa structure can be eliminated and the device accordingly can be constructed at a reduced cost. The planar semiconductor device thus obtained has various advantages the capability of operating in a high temperature and a highly radioactive environment, effective device isolation, high integration density, low leakage current, and easy construction of a multi-level interconnection structure.

Other objects and further features of the present invention will become apparent from the following detailed description when read in conjunction with attached drawings.

DETAILED DESCRIPTION

Figure 2A:
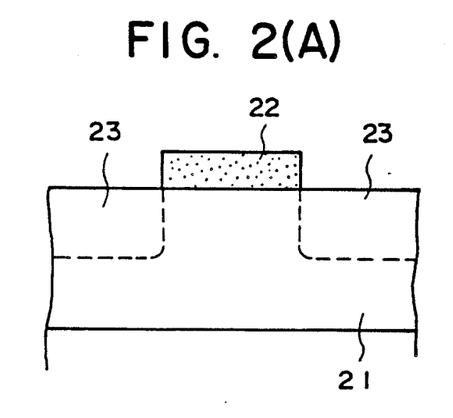
FIGS. 2(A) and 2(B) are diagrams for explaining the principle of the present invention.

FIGS. 2(A) and 2(B) show the principle of the present invention. Referring to FIG. 2(A), a part of a silicon carbide substrate 21 on which a semiconductor device is to be formed is covered by a photoresist 22 and an impurity, such as phosphorus (P), boron (B), arsenic (As) or a compound of these elements, is introduced into an uncovered part of the silicon carbide substrate. As a result, impurity region 23 doped with the impurity are formed. Further, the photoresist 22 is removed and the structure of FIG. 2(A) is subjected to thermal oxidation.

Figure 3:
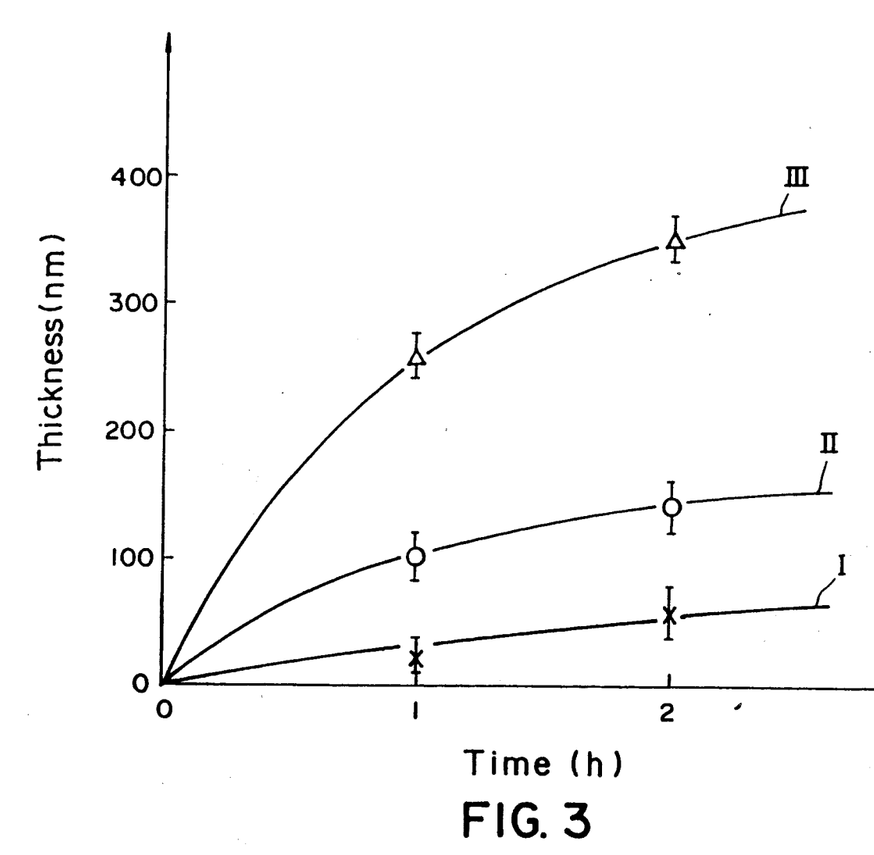
FIG. 3 is a graph showing oxidation of silicon carbide doped with boron with various doses as a function of time.

FIG. 3 shows a result of an experiment conducted to evaluate the oxidation rate of silicon carbide doped to various dopant concentration levels. The experiment was conducted on a specimen of silicon carbide in which B is introduced by ion implantation with an acceleration voltage of 80 keV. The specimen was further heat treated in a reaction vessel (not shown) under an atmosphere containing oxygen at 1050° C. The oxygen partial pressure was controlled by flowing oxygen and hydrogen into the reaction vessel such that there was established a water vapor pressure of 760 Torr in the reaction vessel. In the drawing, the curve I represents a case in which boron ions ($B^{30}$) is introduced by ion implantation with a dose of $5 \times 10^{12}$ cm$^{-2}$, the curve II represents a case in which the dose is $1 \times 10^{14}$ cm$^{-2}$, and the curve III represents a case in which the dose is $1 \times 10^{15}$ cm$^{-2}$. As can be clearly seen from the drawing, the rate of oxidation, represented by the thickness of silicon oxide film grown on the silicon carbide, is increased with increasing concentration of B in the specimen. The thickness of the silicon oxide film after the heat treatment for one hour is summarized in the following Table I.

TABLE I

| relation between oxidation rate and dose of boron in silicon carbide | |
|---|---|
| dose (cm$^{-2}$) | SiO$_2$ thickness (nm) |
| $5 \times 10^{12}$ | 20 |
| $1 \times 10^{14}$ | 100 |
| $1 \times 10^{15}$ | 250 |

Generally, it was found that the oxidation rate of undoped or pure silicon carbide measured in the temperature range of 950–1150° C. is only about 4–8% of that of silicon while when the impurity such as B, P, As or compound of these elements is introduced with a concentration level of more than about $1 \times 10^{19}$ cm$^{-3}$, the oxidation rate increases to as much as 40–60% of that of silicon.

Figure 2B:
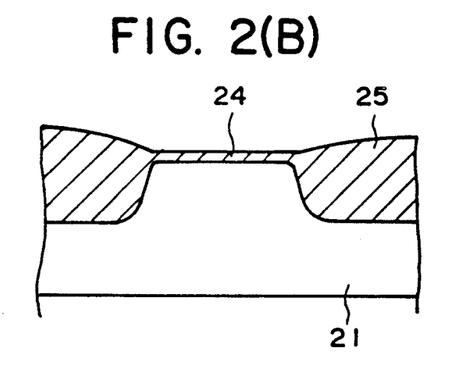

Thus, as a result of heat treatment of the structure of FIG. 2(A) for a limited duration, and as shown in FIG. 2(B) a thick oxide layer 25 is formed in the impurity region 23 because of the increased oxidation rate. On the other hand, there is formed only a thin oxide layer 24 on the part of the substrate 21 on which the device is to be formed. In one example, an oxide layer having a thickness in the range of 400–800 nm and a breakdown voltage of 6–10 MV/cm was obtained by oxidation for a time period range of from two through four hours. Using the technique disclosed herein, one can construct a planar semiconductor device on a silicon carbide substrate and the problems associated with the prior art semiconductor device can be successfully eliminated.

Next, the present invention will be described in more detail with respect to a first embodiment with reference to FIGS. 4(A)–6(E). In this embodiment, the semiconductor device is a MOSFET.

Figure 4A:
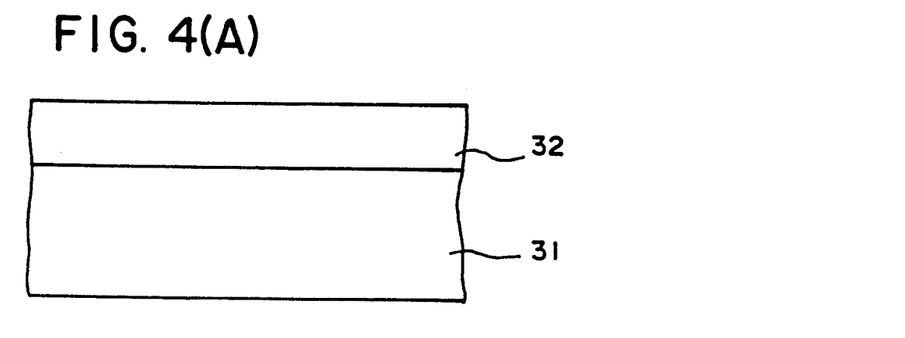
FIGS. 4(A)–4(E) are diagrams showing various steps of manufacturing a MOSFET on a silicon carbide layer.

Referring to FIG. 4(A), a layer 32 of β-phase silicon carbide (referred to hereinafter as β-SiC) is grown on a (111) surface of an n-type silicon substrate 31 having a resistivity of 1–10Ω-cm by chemical vapor deposition. In one example, the growth is made by introducing trichlorosilane (SiHCl$_3$) and propane (C$_3$H$_8$) into a reactor (not shown) as source gases. As the SiHCl$_3$ is supplied in the liquid form, the introduction of the source gas is performed by bubbling using hydrogen (H$_2$). The growth is made at a reduced pressure of 3.0 Torr and a temperature of 1000° C. The flow rate of SiHCl$_3$, C$_3$H$_8$ and H$_2$ is adjusted such that the partial pressure of SiHCl$_3$, C$_3$H$_8$ and H$_2$ are respectively $3.57 \times 10^{-4}$ Torr, $1.53 \times 10^{-5}$ Torr, and $3.57 \times 10^{-3}$ Torr. At the time of growth of the silicon carbide layer 32, a diborane (B$_2$H$_6$) gas is added to the source gas so that the obtained silicon carbide layer 32 is doped to the p-type and has a resistivity of 1–10 Ωcm.

Next, a photoresist 33 is applied on the SiC layer 32 in correspondence to a region in which the semiconductor device is to be formed and the structure thus obtained is subjected to ion implantation of phosphorus ion (P+) using the photoresist 33 as a mask. The ion implantation is made under an acceleration voltage of 80–120 keV with a dose of $10^{14}$ – cm$^{-2}$ and thus an impurity region 34 is formed in correspondence to the device isolation structure as shown in FIG. 4(B).

Figure 4B:
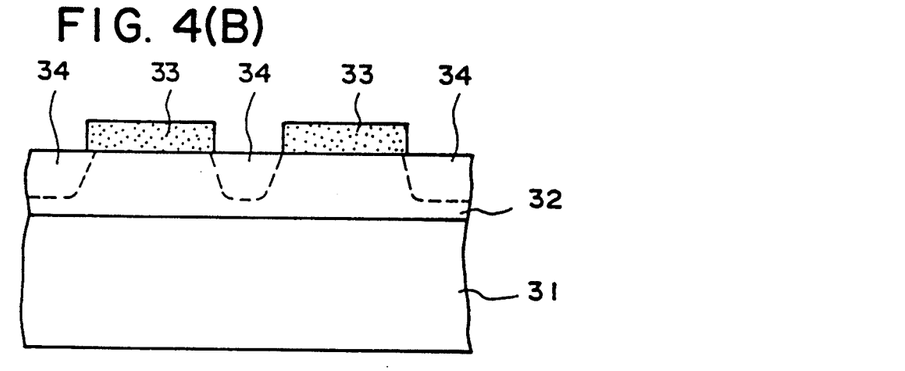
Figure 4C:
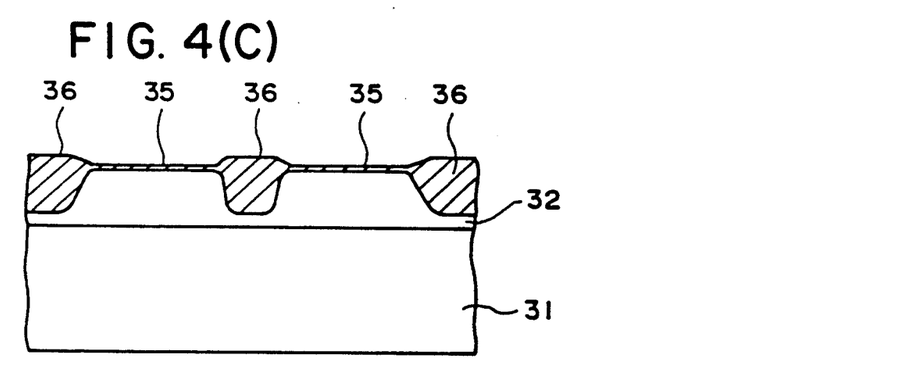

After the removal of the photoresist 33, the structure of FIG. 4(B) is oxidized in a thermal oxidation furnace at 1050° C. for two hours under one atmosphere while flowing oxygen and hydrogen thereover, such that the partial pressure of water vapor (H$_2$0) formed in the furnace is maintained at about 760 Torr. As a result, as illustrated in FIG. 4(C), a thin oxide layer 35 is formed in correspondence to the regions protected by the photoresist against ion implantation. On the other hand, there is formed a thick oxide layer 36 in correspondence to the impurity regions 34 in a thickness of about 400–600 nm.

Figure 4D:
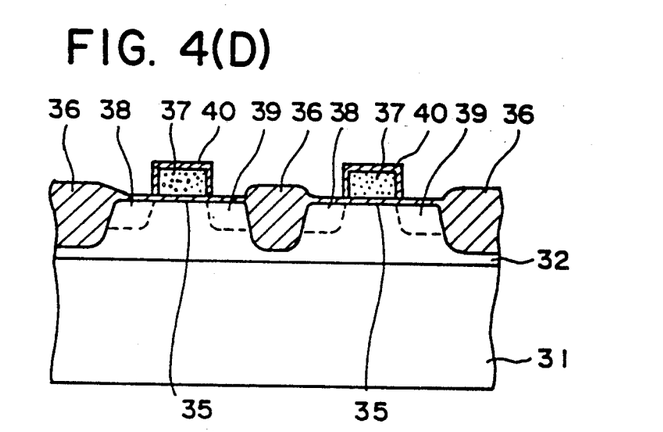
Figure 4E:
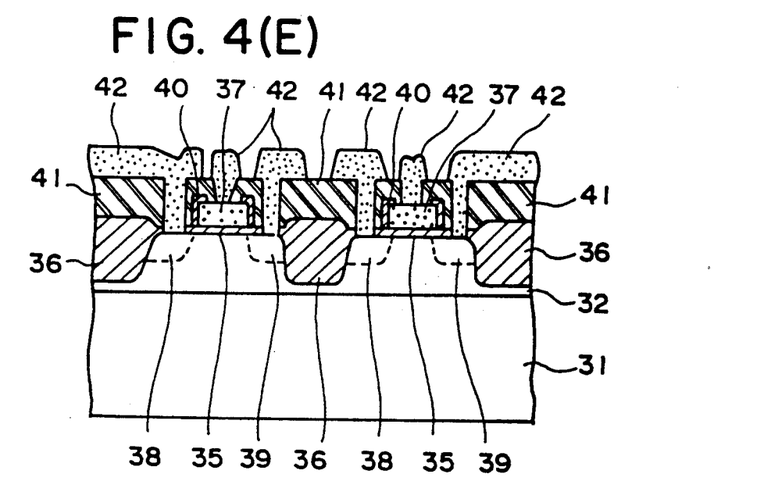

Next, a polysilicon layer is deposited on the thin oxide layer 35 and after suitable patterning to form a gate electrode 37 as shown in FIG. 4(D), a source region 38 and a drain region 39 are formed by ion implantation of P+ using the gate electrode 37 as well as the thick oxide layer 36 as the mask. Further, the surface of the gate electrode 37 is oxidized and an oxide film 40 covering the gate electrode 37 is formed.

Further, a phosphosilicate glass (PSG) layer 41 is deposited on the structure of FIG. 4(D) as an interlayer insulator and contact holes are provided in the PSG layer 41 as well as in the silicon oxide layers 35 and 40 existing under the layer 41, in correspondence to the source region 38, drain region 39 and the gate electrode 37. After deposition of aluminum layer 42 on the PSG layer 41 in contact with the regions 38 and 39 as well as in contact with the gate electrode 37 and subsequent patterning, the MOSFET shown in FIG. 4(E) is completed.

According to the present invention, the oxidation rate of the SiC 32 is selectively enhanced by introducing an impurity at a large dosage and the thick oxide layer 35 is formed exactly in correspondence to the device isolation structure. Further, by changing the energy of ion implantation, the thickness of the oxide layer 35 is controlled easily. As the MOSFET obtained by the process of the present invention has a planar structure, the step of providing the mesa structure as well as the step for obtaining a flat top surface suitable for interlayer connection is eliminated and the manufacturing process is significantly simplified. Associated therewith, the degree of integration can be increased and the leakage current is minimized.

Next, a second embodiment of the present invention will be described with reference to FIGS. 5(A)–(E). In this embodiment, the semiconductor device is a bipolar transistor.

Figure 5A:
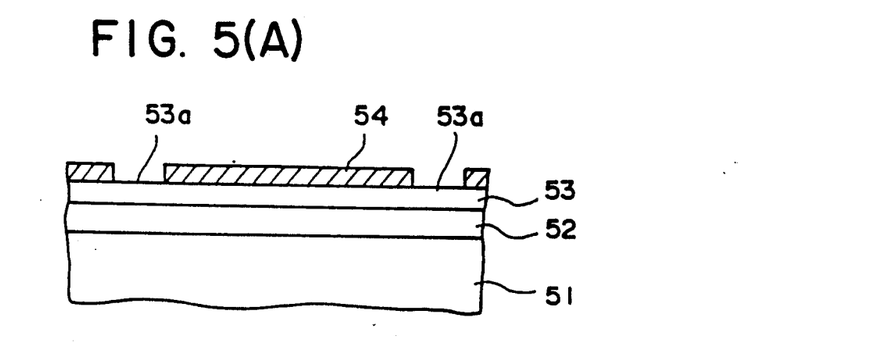
FIGS. 5(A)–5(E) are diagrams showing various steps of manufacturing a bipolar transistor on a silicon carbide layer.

In this embodiment, an n+-type η-SiC layer 52 and an n-type β-SiC layer 53 are grown in succession on a silicon substrate 51, similarly to the first embodiment, with a thickness of 3000 Å for the layer of 52 and 2000 Å for the layer 53. During the growth of the layers 52 and 53, phosphine (PH$_3$) is added to the source gas with a partial pressure of $1.02 \times 10^{-8}$ Torr and a partial pressure of $1.53 \times 10^{-10}$ Torr respectively for the succession layers 52 and 53 so that the layer 52 and the layer 53 are doped to carrier concentration levels of $5 \times 10^{18}$ cm$^{-3}$ and $1 \times 10^{17}$ cm$^{-3}$, respectively. Next, a photoresist 54 is applied on the layer 53 and subsequently patterned so as to expose parts 53a of the SiC layer 53, corresponding to the device isolation structure to be formed. FIG. 5(A) shows the structure obtained by the foregoing procedures.

Figure 5B:
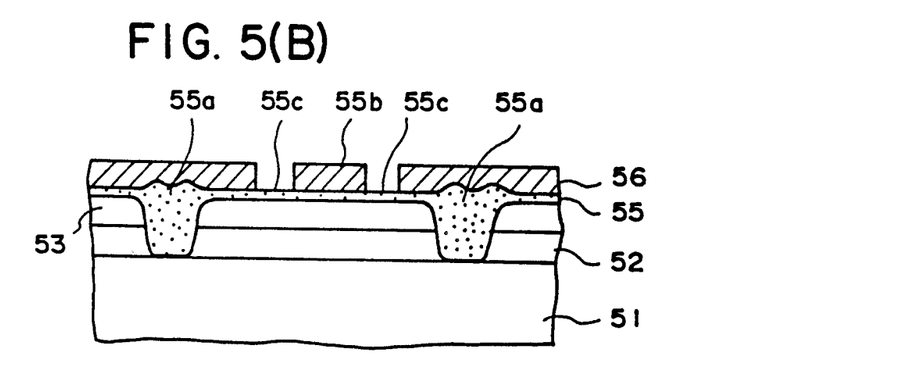

Next, B+ is introduced to the exposed parts 53a of the SiC layer 53 by ion implantation under an acceleration voltage of 400 keV with a dose of about $5 \times 10^{-14}$ cm$^{-2}$ to about $1 \times 10^{15}$ cm$^{-2}$. Further, the structure thus processed is annealed at 1100° C., one atmosphere with a H$_2$O partial pressure of 760 Torr and a device isolation oxide layer 55 is formed. Note that the device isolation oxide layer 55 thus formed includes large thickness regions 55a, having a thickness corresponding to the total thickness of the SiC layers 52 and 53 at the regions in which the ion implantation of B+ is made and small thickness regions 55b in correspondence to the region in which the ion implantation is not made. The structure thus obtained has further applied thereto a photoresist 56, which is subsequently patterned so as to expose a part 55c of the thin oxide region 55b at both sides of the emitter to be formed in the structure. Thus, a structure shown in FIG. 5(B) is obtained.

Figure 5C:
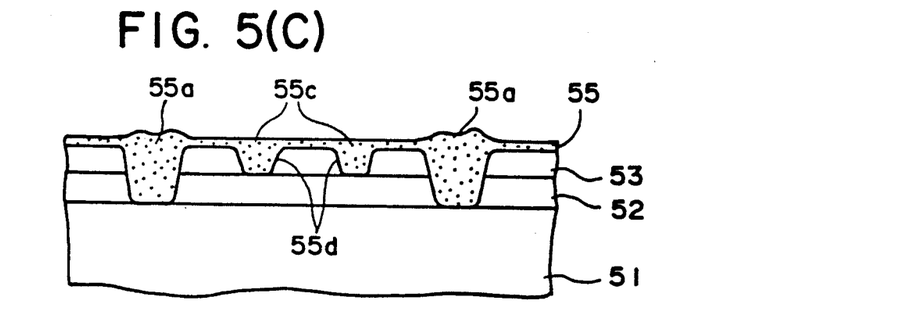

After injecting B+ under an acceleration voltage of 100 keV with a dose of $5 \times 10^{14} - 1 \times 10^{15}$ cm$^{-2}$, the structure of FIG. 5(C) is heat treated similarly to the foregoing case and a pair of oxide regions 55d as shown in FIG. 5(C) are formed.

The structure of FIG. 5(C) has further deposited thereon a thin silicon nitride layer 57 by chemical vapor deposition and a part of the layer 57 corresponding to the emitter and the base of the bipolar transistor is selectively removed by etching. After the etching, a part of the silicon oxide layer 55b underlying the removed part of the layer 57 is further etched and a p-type β-SiC layer 58 is subsequently grown, so as to make contact with a part of the SiC layer 53 exposed by the foregoing etching process, to a thickness of about 500-1000 Å. The growth of the SiC layer 58 is performed similarly to the case of growing the layers 52 and 53 except that B$_2$H$_6$ or trimethyl boron is added to the source gas such that the SiC layer 58 is doped to the p-type, with a hole concentration level of about $5 \times 10^{19}$ cm$^{-3}$. For this purpose, the partial pressure of B$_2$H$_6$ is set to $1-5 \times 10^{-7}$ Torr. When trimethyl boron is used, the partial pressure is set to $3-5 \times 10^{-8}$ Torr. The SiC layer 58 is further removed selectively by plasma etching using nitrogen trifluoride NF$_3$ so that only a part of the layer 58 corresponding to the base of the bipolar transistor and making a direct contact with the exposed part of the SiC layer 53 is left as illustrated in FIG. 5(D).

Figure 5D:
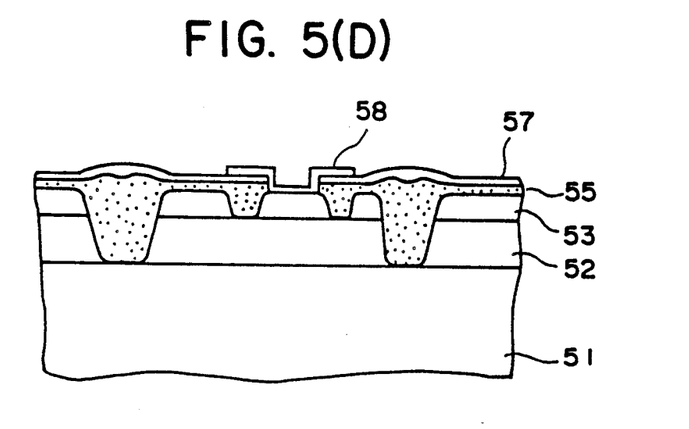
Figure 5E:
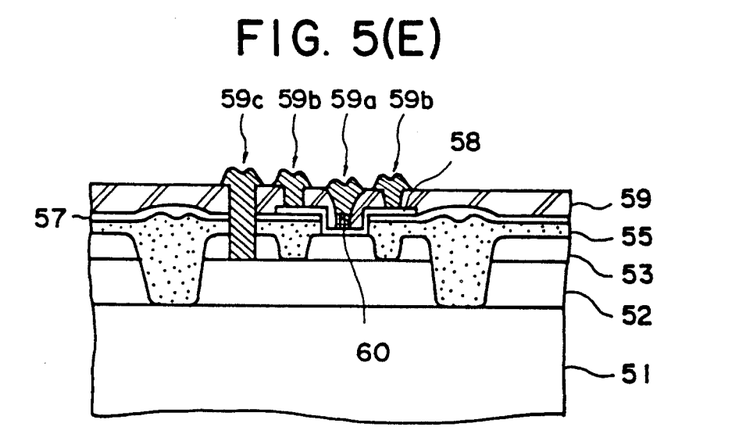

Further, a silicon oxide layer 59 is deposited on the structure of FIG. 5(D) by chemical vapor deposition and a contact hole 59a is provided so as to expose the foregoing part of the SiC layer 58 in contact with the layer 53. After the contact hole 59a is formed, an n+-type SiC layer 60 is grown on the SiC layer 58 in correspondence to the contact hole 59a to a thickness of about 2000 Å by a process similar to that used for growing the layers 52 and 53, except that the partial pressure for PH$_3$ is set to $1.02 \times 10^{-7}$ Torr so that a carrier concentration level of about $5 \times 10^{19}$ cm$^{-3}$ is obtained. The layer 60 is then patterned so that only a part thereof corresponding to the emitter of the transistor is left on the part of the layer 58 making a direct contact with the underlying SiC layer 53. Further, after formation of the contact holes 59b and 59c for the base and collector of the bipolar transistor, aluminum is deposited so as to fill the contact holes 59a –59c and is suitably masked and etched to form aluminum emitter, base and collector contacts 59a', 59b', 59c', respectively and the bipolar transistor is completed.

In this process, too, the selective oxidation of SiC facilitates the formation of the device isolation structure. Thus, the bipolar transistor can be formed by a simple procedure without providing the mesa structure.

Although the process for introducing the impurity into the silicon carbide layer described heretofore is ion implantation, the present invention is not limited to such and instead a solid diffusion process or a vapor phase diffusion process can be employed similarly for this purpose. Further, the impurity to be introduced into silicon carbide for selective oxidation is not limited to B and P, but As may be used with substantially the same result. The substrate 21, 31 or 51 is not limited to silicon single crystal but may be a bulk silicon carbide or a silicon epitaxial layer grown of an insulator such as sapphire.

Further, the present invention is not limited to these embodiments but various variations and modifications may be made without departing from the scope of the invention.

What is claimed is:

1. A method of forming a semiconductor device on a silicon carbide layer, comprising the steps of:

defining at least one device region and associated device isolation regions in the silicon carbide layer;

selectively introducing an impurity into the device isolation regions of the silicon carbide layer at a concentration level sufficient to impart an enhanced rate of oxidation characteristic to said defined, device isolation regions, relatively to the rate of oxidation characteristic of the remainder of the silicon carbide layer including each said associated device region;

oxidizing the silicon carbide layer by annealing in an oxidizing atmosphere and thereby forming an oxide layer on the silicon carbide layer, the oxide layer so formed in the device isolation regions being substantially thicker than that in each said associated device region and extending to a sufficient depth in the silicon carbide layer thereby to afford electrical isolation of a device to be formed in the associated device region; and forming a semiconductor device in the device region.

2. A method as claimed in claim 1 in which said impurity is selected from a group of elements comprising boron, phosphorus, and arsenic.

3. A method as claimed in claim 1 in which said impurity is introduced with a concentration level of about $1 \times 10^{19}$ cm$^{-3}$ or more.

4. A method as claimed in claim 1 in which said impurity is introduced into the silicon carbide layer by ion implantation.

5. A method as claimed in claim 4 in which said ion implantation is made with a dose of about $10^{14} - 10^{15}$ cm$^{-2}$.

6. A method as claimed in claim 1 which said annealing is performed at a temperature ranging from 950° C-1150° C.

7. A method as claimed in claim 1 in which said silicon carbide layer is formed on a single crystal silicon.

8. A method as claimed in claim 1 in which said silicon carbide layer is formed on a silicon carbide bulk crystal.

9. A method as claimed in claim 1 in which said silicon carbide layer is formed on a silicon layer grown on an insulator.

10. A method as claimed in claim 1 wherein said step of forming the semiconductor device comprises:
   providing a gate electrode on a part of the oxide layer covering said device region; and
   introducing an impurity into said device region by ion implantation using the gate electrode as a mask.

11. A method as claimed in claim 1 wherein said step of forming the semiconductor device comprises:
   exposing the silicon carbide layer at a part of the device region by removing the oxide layer therefrom;
   depositing a second silicon carbide layer with a conduction type opposite to the conduction type of the first silicon carbide layer so as to make a direct contact with the exposed part of the first silicon carbide layer; and
   depositing a third silicon carbide layer with a conduction type identical to that of the first silicon carbide layer so as to make a direct contact of said third silicon carbide layer with a part of the second silicon carbide layer.

12. A method as claimed in claim 1, wherein the silicon carbide layer is supported on a substrate, further comprising:
   performing said oxidizing step for a sufficient time to produce an oxide layer on each device isolation region which extends fully through the silicon carbide layer to the substrate.

* * * * *